(12) United States Patent
Kakkad et al.

(10) Patent No.: US 7,544,550 B2
(45) Date of Patent: Jun. 9, 2009

(54) METHOD OF FABRICATING SEMICONDUCTOR DEVICE AND SEMICONDUCTOR FABRICATED BY THE SAME METHOD

(75) Inventors: Ramesh Kakkad, Suwon-si (KR); Yong-Seog Kim, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 59 days.

(21) Appl. No.: 11/083,203

(22) Filed: Mar. 18, 2005

(65) Prior Publication Data

US 2006/0003502 A1 Jan. 5, 2006

(30) Foreign Application Priority Data

Jul. 5, 2004 (KR) .............. 10-2004-0052054

(51) Int. Cl.
*H01L 21/20* (2006.01)
*H01L 21/335* (2006.01)

(52) U.S. Cl. ..................... 438/166; 438/486

(58) Field of Classification Search ............ 438/142, 438/166, 96, 87, 486, 488
See application file for complete search history.

(56) References Cited

U.S. PATENT DOCUMENTS 6,066,516 A * 5/2000 Miyasaka ............ 438/149
6,881,618 B2 * 4/2005 Yamamoto ............ 438/199

2002/0102820 A1 8/2002 Hamada

FOREIGN PATENT DOCUMENTS

| CN | 1108004 | 9/1995 |
|----|---------|--------|
| JP | 63-304670 | 12/1988 |
| JP | 5-21463 | 1/1993 |

(Continued)

OTHER PUBLICATIONS

Watakabe et al "Polycrystalline Silicon Thin-Film Transistor Fabricated by defect reduction Methods" IEEE Transactions on Electtron Devices, vol. 49m, No. 12 Dec. 2002.*
Japanese Office action corresponding to Japanese Patent Application No. 2005-071258, issued on Jul. 10, 2007.

(Continued)

*Primary Examiner*—Savitri Mulpuri
(74) *Attorney, Agent, or Firm*—Robert E. Bushnell, Esq.

(57) ABSTRACT

A semiconductor device and method of fabricating the same are provided. The method includes: depositing a silicon layer containing amorphous silicon on a substrate; defining source and drain regions by doping the silicon layer with impurity ions; crystallizing the amorphous silicon by an annealing process under an atmosphere of $H_2O$ at a predetermined temperature, and at the same time activating the impurity ions to form a semiconductor layer; forming a gate insulating layer over the entire surface of the substrate having the semiconductor layer; and forming a gate electrode on the gate insulating layer in correspondence with a channel region of the semiconductor layer, in which the annealing process is simplified by crystallizing the polycrystalline silicon and at the same time activating the impurity ions, thereby preventing the substrate from being deformed due to high temperature during the annealing process.

20 Claims, 4 Drawing Sheets

FOREIGN PATENT DOCUMENTS

| | | |
|---|---|---|
| JP | 8-51212 | 2/1996 |
| JP | 08-330598 | 12/1996 |
| JP | 11-261078 | 9/1999 |
| JP | 2002-083970 | 3/2002 |
| JP | 2002-110695 | 4/2002 |
| JP | 2002-261290 | 9/2002 |
| JP | 2003-168803 | 6/2003 |
| JP | 2004-55771 | 2/2004 |
| KR | 1995-9981 | 4/1995 |
| KR | 10-1995-0014379 | 11/1995 |
| KR | 1997-8658 | 2/1997 |
| KR | 10-1997-0024247 | 5/1997 |

OTHER PUBLICATIONS

*The Office Action* from the Chinese Patent Office issued in Applicant's corresponding Chinese Patent Application No. 200510064063.4 dated Nov. 9, 2007.

Watakabe et al., *Polycrystalline Silicon Thin-Film Transistors Fabricated by Defect Reduction Methods*, IEEE Transactions on Electron Devices, vol. 49, No. 12, pp. 2217-2221.

The Office Action from the Japanese Patent Office issued in Applicant's corresponding Japanese Patent Application No. 2005-071258 dated Oct. 30, 2007.

* cited by examiner

METHOD OF FABRICATING SEMICONDUCTOR DEVICE AND SEMICONDUCTOR FABRICATED BY THE SAME METHOD

CLAIM OF PRIORITY

This application makes reference to, incorporates the same herein, and claims all benefits accruing under 35 U.S.C. §119 from an application entitled METHOD OF FABRICATING SEMICONDUCTOR DEVICE AND SEMICONDUCTOR FABRICATED BY THE SAME METHOD filed with the Korean Industrial Property Office on 5 Jul. 2004 and there duly assigned Serial. No. 2004-52054.

BACKGROUND OF THE INVENTION

1. Field of the Invention

The present invention relates to a method of fabricating a semiconductor device and a semiconductor device fabricated by the same method, and more particularly, to a method of fabricating a semiconductor device which is capable of crystallizing polycrystalline silicon with excellent crystallinity and preventing a substrate from being bent due to a high crystallization temperature upon crystallization, and a semiconductor device fabricated by the same method.

2. Description of the Related Art

Polycrystalline silicon is used in an active device for an organic light emitting display device, normally, thin film transistors (TFTs), which is used to supply current to pixel regions and peripheral driving regions.

In general, the polycrystalline silicon is formed by crystallization of amorphous silicon.

Normally, methods for the crystallization may be largely classified into a low-temperature crystallization method and a high-temperature crystallization method depending on a crystallization temperature, for example, with reference to about 500° C.

An excimer laser annealing (ELA) method using an excimer laser is mainly used as the low-temperature crystallization method. The excimer laser annealing method may use a glass substrate since it is carried out at a crystallization temperature of about 450° C. However, manufacturing cost is high and the substrate is constrained in an optimal size, thereby increasing total cost to fabricate a display device.

The high-temperature crystallization method includes a solid phase crystallization method, a rapid thermal annealing method, and the like. A low-cost annealing method is widely used as the high-temperature crystallization method.

However, since the solid phase crystallization method requires heating at a temperature of more than 600° C. for 20 or more hours for crystallization, many crystal defects are included in the crystallized polycrystalline silicon. Accordingly, sufficient electric field mobility cannot be obtained, the substrate is prone to deform during an annealing process, i.e., a heat treatment process, and lowered crystallization temperature degrades productivity. Because the solid phase crystallization method is also performed at high crystallization temperature, the glass substrate is not allowed to use.

Meanwhile, although the rapid thermal annealing (RTA) method may be accomplished in relatively short time, the substrate is prone to deform due to severe thermal shock and the crystallized polycrystalline silicon has poor electrical characteristics.

Consequently, a low-cost high-temperature annealing method may be required to be used upon the crystallization in order to reduce cost to fabricate the active device. Moreover, there is a need for a high-temperature annealing method using an inexpensive glass substrate, by which the glass substrate is not bent and crystallinity is excellent.

Meanwhile, a method of fabricating a semiconductor device has been disclosed in Korean Patent Publication No. 1997-8658, which includes: depositing an amorphous silicon layer on a substrate; crystallizing the amorphous silicon layer using a laser annealing method; forming an impurity region on the crystallized polycrystalline silicon layer; and activating the impurity region using an RTA process.

Further, a method of fabricating a semiconductor device has been disclosed in Korean Patent Publication No. 1995-9981, which includes: crystallizing an amorphous silicon layer by 50% or less by etching the amorphous silicon layer formed on a substrate and at the same time annealing the amorphous silicon layer; and crystallizing the amorphous silicon layer again using an RTA process, thereby fabricating a polycrystalline silicon thin film crystallized by 90% or more.

However, the foregoing conventional methods include the complicate processes of crystallizing the amorphous silicon and crystallizing the amorphous silicon again while the impurity region is activated at a high temperature. Further, in the foregoing conventional methods, the RTA process for activating the impurity region is generally performed at a very high temperature of 700~950° C. (e.g., 1,000° C. or more in the case of Korean Patent Publication No. 1995-9981), so that the substrate is likely to be deformed.

SUMMARY OF THE INVENTION

The present invention, therefore, solves aforementioned problems associated with conventional devices by providing a method of fabricating a semiconductor device in which an annealing process is simplified by crystallizing polycrystalline silicon with excellent crystallinity and at the same time activating an impurity region, thereby preventing a substrate from being bent due to a high annealing temperature, and a semiconductor device employing the polycrystalline silicon fabricated by the same method.

In an exemplary embodiment of the present invention, a method of fabricating a semiconductor device includes: depositing a silicon layer containing amorphous silicon on a substrate; defining source and drain regions by doping the silicon layer with impurity ions; crystallizing the amorphous silicon by an annealing process under an atmosphere of $H_2O$ at a predetermined temperature, and at the same time activating the impurity ions to form a semiconductor layer; forming a gate insulating layer over the entire surface of the substrate having the semiconductor layer; and forming a gate electrode on the gate insulating layer in correspondence with a channel region of the semiconductor layer.

In another exemplary embodiment of the present invention, a method of fabricating a semiconductor device includes: forming a gate electrode on a substrate; forming a gate insulating layer over the entire surface of the substrate having the gate electrode; depositing a silicon layer containing amorphous silicon on the gate insulating layer; defining source and drain regions by doping the silicon layer with impurity ions using a photoresist; crystallizing the amorphous silicon by an annealing process under an atmosphere of $H_2O$ at a predetermined temperature, and at the same time activating the impurity ions to form a semiconductor layer, after removing the photoresist. In yet another exemplary embodiment of the present invention, a semiconductor device fabricated by the foregoing methods includes a polycrystalline silicon thin layer having a full-width-half-maximum of 7.5 $cm^{-1}$ or less.

The semiconductor device may be used for an organic light emitting display or a liquid crystal display.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
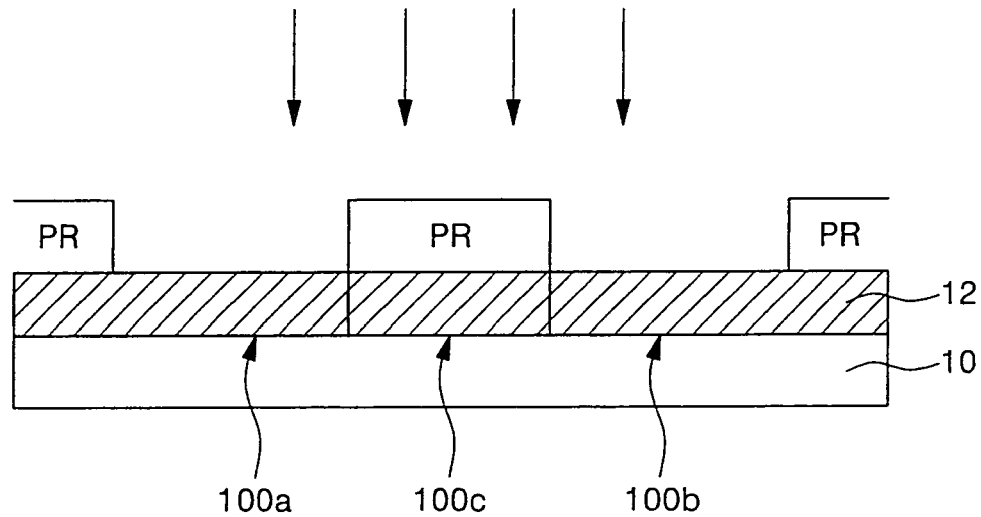
FIGS. 1A to 1E sequentially illustrate a method of fabricating a semiconductor device according to a first embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIGS. 1A to 1E sequentially illustrate a method of fabricating a semiconductor device according to a first embodiment of the present invention in sequence.

Referring to FIG. 1A, amorphous silicon or a silicon layer 12 containing a great quantity of amorphous silicon is deposited on a substrate 10. Here, the substrate 10 is generally formed of a transparent glass substrate.

Further, the silicon layer 12 may be deposited by a typical deposition method such as a plasma enhanced chemical vapor deposition (PECVD) method, a low-pressure chemical vapor deposition (LPCVD) method, or the like.

Additionally, a buffer layer such as a silicon nitride (SiNx) layer or a silicon oxide ($SiO_2$) layer may be interposed between the substrate 10 and the amorphous silicon layer 12 prior to depositing the amorphous silicon layer, in order to prevent contaminants or the like created in the substrate from diffusing into the silicon layer 12 or enhance interfacial characteristics between the silicon layer 12 and the substrate 10.

Photoresist is applied to the surface of the silicon layer 12 excluding regions corresponding to source and drain regions 100a and 100b, and then impurity ions are doped into the silicon layer 12.

Figure 1B:
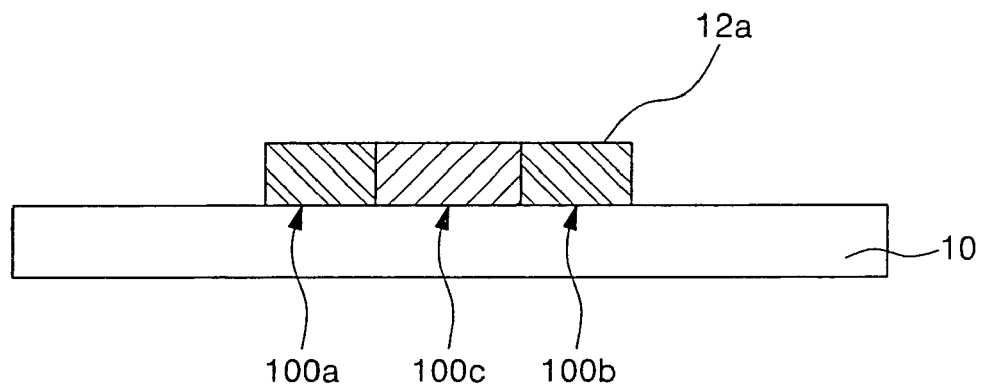

Referring to FIG. 1B, the photoresist is removed by photolithography and etching processes, and then the doped silicon layer 12 is patterned. Alternatively, the process of patterning the silicon layer 12 may be performed after an annealing process to be described below is performed.

Then, the annealing process is performed.

During the annealing process, the impurity ions doped into the source and drain regions 100a and 100b are activated, and at the same time the silicon layer 12 containing the amorphous silicon is crystallized into a polycrystalline silicon layer 12a.

In this embodiment, the annealing process is performed by a general high temperature annealing process such as a rapid thermal annealing (RTA) process, but is performed under an atmosphere of $H_2O$ contrary to the conventional annealing process performed under an atmosphere of $N_2$ or $O_2$.

The annealing process performed under the atmosphere of $H_2O$ shortens annealing time under a condition of the same temperature and reduces annealing temperature under a condition of the same time, compared to the conventional annealing process performed under the atmosphere of $N_2$ or $O_2$.

In particular, according to an embodiment of the present invention, the annealing temperature is lowered, thereby solving the problem that an insulating and transparent substrate such as glass is conventionally deformed due to the high temperature.

According to an embodiment of the present invention, the annealing temperature preferably ranges from 550° C. to 750° C., and more preferably ranges from 600° C. to 710° C. When the annealing temperature is 550° C. or less, the crystallization is not accomplished. Also, when the annealing temperature is 750° C. or more, the substrate is easily deformed. On the other hand, when the annealing temperature is in the range of 600° C. to 710° C., the excellent polycrystalline silicon is obtained because of the proper annealing time.

Meanwhile, $H_2O$ pressure is preferably in the range of 10,000 Pa to 2 Mpa. Here, crystallization rate is proportional to the $H_2O$ pressure. In the case of too low pressure, the crystallization rate is decreased and thus the annealing time is increased, thereby badly affecting the substrate. In the case of too high pressure, there is a risk of explosion. Hence, it is preferable that the $H_2O$ pressure is in the range of 10,000 Pa to 2 Mpa.

Meanwhile, it is preferable to deposit the silicon layer 12 to a thickness of less than 2,000 Å. Small thickness facilitates crystallization. However, too small thickness may affect the device characteristics when the polycrystalline silicon is used to form a thin film transistor. Accordingly, it is more preferable to deposit the silicon layer to a thickness of 300 to 1,000 Å.

The foregoing processes are enough to form the polycrystalline silicon. However, according to an embodiment of the present invention, the annealing process is performed once more to decrease defects of the crystallized polycrystalline silicon. Here, the additional annealing process may be performed by an excimer laser annealing (ELA) process or heating in a furnace.

Figure 1C:
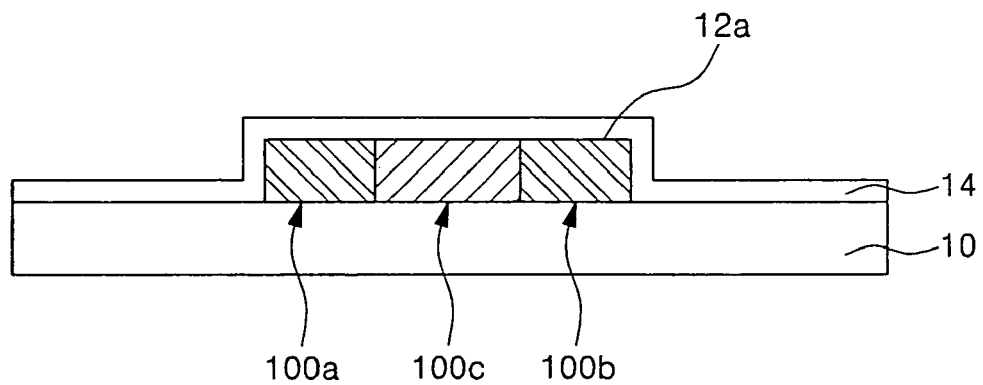

Then, as shown in FIG. 1C, an inorganic insulating layer such as $SiO_2$ or SiNx is formed as a gate insulating layer on the patterned silicon layer 12a.

Figure 1D:
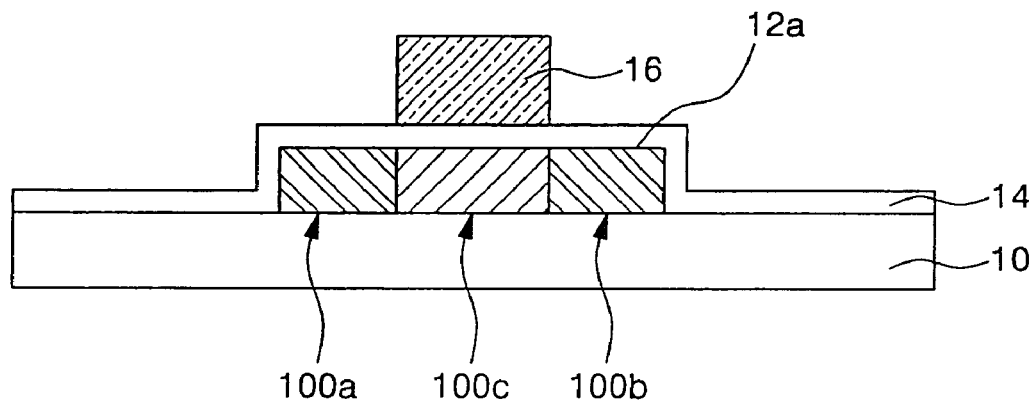

Subsequently, as shown in FIG. 1D, a gate 16 is formed on a region corresponding to a channel region 100c.

Figure 1E:
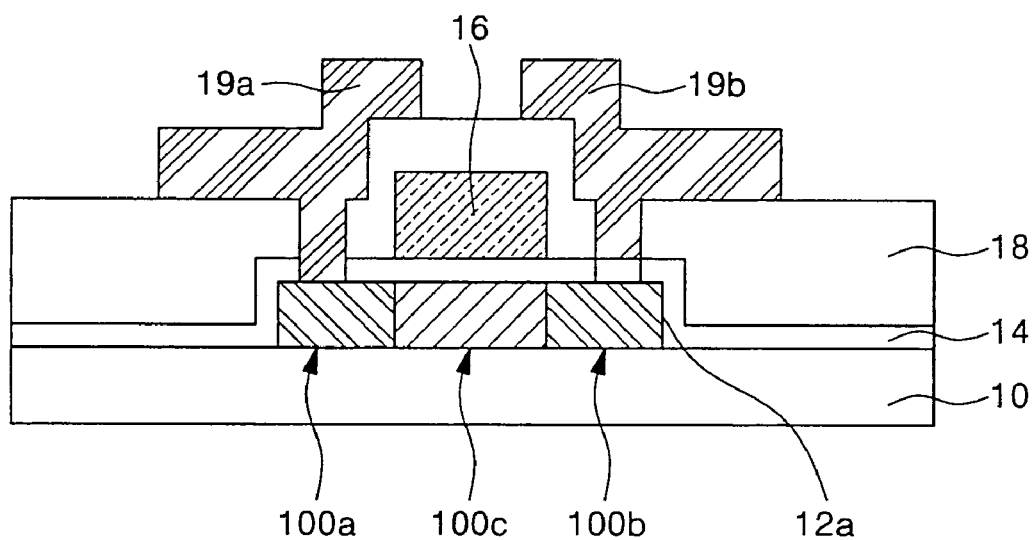

Then, as shown in FIG. 1E, an interlayer insulating layer 18 is formed over the entire surface of the substrate 10 having the gate 16. Then, the interlayer insulating layer 18 and the gate insulating layer are etched to open the source and drain regions 100a and 100b, thereby forming contact holes. Then, the contact holes are filled with metal to form source and drain electrodes 19a and 19b, thereby completing the thin film transistor.

FIGS. 2A to 2D sequentially illustrate a method of fabricating a semiconductor device according to a second embodiment of the present invention.

Figure 2A:
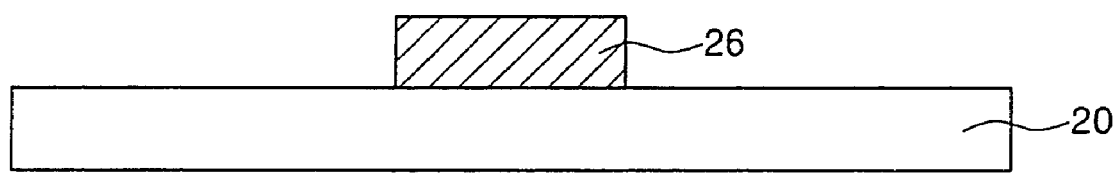
FIGS. 2A to 2D sequentially illustrate a method of fabricating a semiconductor device according to a second embodiment of the present invention.

Referring to FIG. 2A, a gate electrode 26 is patterned on a substrate 20. Here, the substrate 10 is generally formed of a transparent glass substrate.

Additionally, a buffer layer such as SiNx or $SiO_2$ may be formed on the substrate 20 in order to prevent contaminants or the like created in the substrate from diffusing into the gate electrode 26 or enhance interfacial characteristics between the gate electrode 26 and the substrate 20.

Figure 2B:
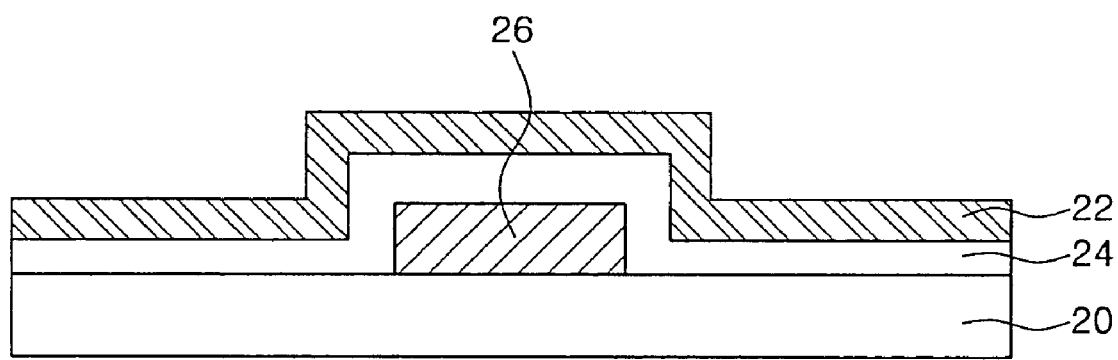

Then, as shown in FIG. 2B, an inorganic insulating layer such as $SiO_2$ or SiNx is formed as a gate insulating layer 24 over the entire surface of the substrate 20 having the gate electrode 26. Subsequently, amorphous silicon or a silicon layer 22 containing a great quantity of amorphous silicon is deposited on the gate insulating layer 24.

Here, the silicon layer 22 may be deposited by a general deposition method such as a PECVD method, an LPCVD method, or the like.

Figure 2C:
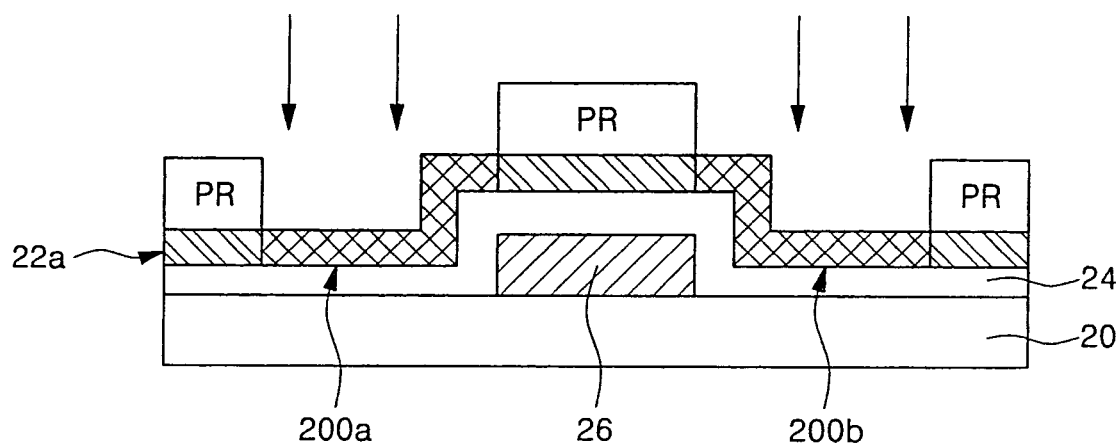

Then, as shown in FIG. 2C, photoresist is applied to the surface of the silicon layer 22 excluding regions corresponding to source and drain regions 200a and 200b, and then the silicon layer 22 is doped with impurity ions. Here, the impurity ions may be doped by a lightly doped drain (LDD) process as well as a highly doping process.

Then, an annealing process is performed. During the annealing process, the impurity ions doped into the source and drain regions 200a and 200b are activated, and at the same time the silicon layer 22 containing the amorphous silicon is crystallized into a polycrystalline silicon layer 22a.

In this embodiment, the annealing process is performed by a general high temperature annealing process such as an RTA process, but is performed under an atmosphere of $H_2O$ contrary to the conventional annealing process performed under an atmosphere of $N_2$ or $O_2$.

The annealing process performed under the atmosphere of $H_2O$ shortens annealing time under a condition of the same temperature and reduces annealing temperature under a condition of the same time, compared to the conventional annealing process performed under the atmosphere of $N_2$ or $O_2$.

In particular, according to an embodiment of the present invention, the annealing temperature is lowered, thereby solving the problem that a transparent substrate such as glass is conventionally deformed due to the high temperature.

According to an embodiment of the present invention, the annealing temperature preferably ranges from 550° C. to 750° C., and more preferably ranges from 600° C. to 710° C. When the annealing temperature is 550° C. or less, the crystallization is not accomplished. Also, when the annealing temperature is of 750° C. or more, the substrate is easily deformed. On the other hand, when the annealing temperature is in the range of 600° C. to 710° C., the excellent polycrystalline silicon is obtained because of the proper annealing time.

Meanwhile, $H_2O$ pressure is preferably in the range of 10,000 Pa to 2 Mpa. Here, crystallization rate is proportional to the $H_2O$ pressure. In the case of too low pressure of $H_2O$, the crystallization rate is decreased and thus the annealing time is increased, thereby badly affecting the substrate. In the case of too high pressure, there is a risk of explosion. Hence, it is preferable that the $H_2O$ pressure is in the range of 10,000 Pa to 2 Mpa.

Meanwhile, it is preferable to deposit the silicon layer 22 to a thickness of less than 2,000 Å. Small thickness facilitates crystallization. However, too small thickness may affect the device characteristics when the polycrystalline silicon is used to form a thin film transistor. Accordingly, it is more preferable to deposit the silicon layer to a thickness of 300 to 1,000 Å.

The foregoing processes are enough to form the polycrystalline silicon. However, according to an embodiment of the present invention, the annealing process is performed once more to decrease defects of the crystallized polycrystalline silicon. Here, the annealing process may be performed by an ELA process or heating in a furnace.

Figure 2D:
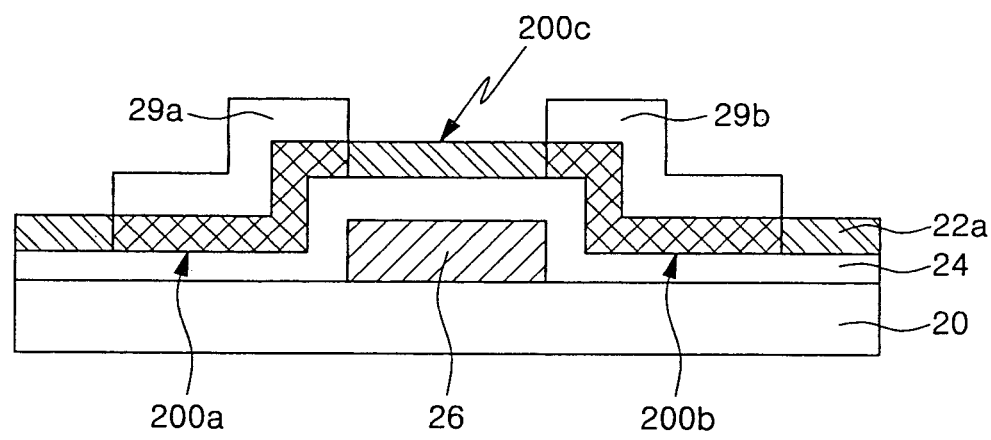

Then, as shown in FIG. 2D, metal is formed over the entire surface of the substrate 20 having the polycrystalline silicon layer 22a, and then patterned to form source and drain electrodes 29a and 29b, thereby fabricating the semiconductor device.

Thus, the semiconductor device according to an embodiment of the present invention may be applied to thin film transistors having a top gate structure and a bottom gate structure. Here, the top gate thin film transistor includes the gate electrode 16 formed on the upper of the polycrystalline silicon layer 12a. Further, the bottom gate thin film transistor includes the gate electrode 26 formed on the lower of the polycrystalline silicon layer 22a.

Meanwhile, such a thin film transistor may be employed in a flat panel display such as an organic electroluminescent display or a liquid crystal display.

As described above, the annealing process is simplified by crystallizing the polycrystalline silicon and at the same time activating impurity ions doped into the semiconductor layer, thereby preventing the substrate from being deformed due to high temperature during the annealing process.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a semiconductor device, comprising:
   depositing a silicon layer comprising undoped amorphous silicon on a substrate;
   defining regions to be formed into source and drain regions by selectively doping the silicon layer with doping impurity ions;
   performing a Solid Phase Crystallization (SPC) of the amorphous silicon and, at the same time, activating the doping impurity ions by a high temperature annealing process under an atmosphere of $H_2O$ at a predetermined temperature to form a semiconductor layer having the source and drain regions contained therein, the predetermined temperature ranging from 550° C. to 750° C.;
   forming a gate insulating layer over an entire surface of the substrate having the semiconductor layer; and
   forming a gate electrode on the gate insulating layer in correspondence with a channel region of the semiconductor layer.

2. The method according to claim 1, wherein the predetermined temperature ranges from 600° C. to 710° C.

3. The method according to claim 1, wherein the $H_2O$ pressure ranges from 10,000 Pa to 2 Mpa.

4. The method according to claim 1, wherein the silicon layer has a thickness of 2,000 Å or less.

5. The method according to claim 4, wherein the silicon layer has a thickness of 300 Å to 1,000 Å.

6. The method according to claim 1, further comprising annealing the silicon layer once more by heating in a furnace or by performing an Excimer Laser Annealing (ELA) process after the annealing process.

7. The method according to claim 1, further comprising patterning the semiconductor layer before crystallizing the semiconductor layer.

8. The method according to claim 1, further comprising patterning the semiconductor layer after crystallizing the semiconductor layer.

9. A method of fabricating a semiconductor device, comprising:

forming a gate electrode on a substrate;

forming a gate insulating layer over an entire surface of the substrate having the gate electrode;

depositing a silicon layer containing amorphous silicon on the gate insulating layer;

defining regions to be formed into source and drain regions by selectively doping the silicon layer with doping impurity ions using a photoresist; and removing the photoresist and then both performing a Solid Phase Crystallization (SPC) of the amorphous silicon and, at the same time, activating the doping impurity ions by a high temperature annealing process under an atmosphere of $H_2O$ at a predetermined temperature to form a semiconductor layer having the source and drain regions contained therein, the predetermined temperature ranging from 550° C. to 750° C.

10. The method according to claim 9, wherein the predetermined temperature ranges from 600° C. to 710° C.

11. The method according to claim 9, wherein the $H_2O$ pressure ranges from 10,000 Pa to 2 Mpa.

12. The method according to claim 9, wherein the silicon layer has a thickness of 2,000 Å or less.

13. The method according to claim 12, wherein the silicon layer has a thickness of 300 Å to 1,000 Å.

14. The method according to claim 9, further comprising annealing the silicon layer once more by heating in a furnace or performing an Excimer Laser Annealing (ELA) process after the annealing process.

15. A semiconductor device fabricated by the method according to claim 1, comprising P-type or N-type thin film transistors.

16. A semiconductor device fabricated by the method according to claim 9, comprising P-type or N-type thin film transistors.

17. The semiconductor device according to claim 15, wherein the semiconductor device is used for an organic light emitting display or a liquid crystal display.

18. The semiconductor device according to claim 16, wherein the semiconductor device is used for an organic light emitting display or a liquid crystal display.

19. The method according to claim 1, wherein the high temperature annealing process comprises a Rapid Thermal Annealing (RTA) process.

20. The method according to claim 9, wherein the high temperature annealing process comprises a Rapid Thermal Annealing (RTA) process.

* * * * *